(12) United States Patent
Yeo

(10) Patent No.: US 10,497,760 B2
(45) Date of Patent: Dec. 3, 2019

(54) DISPLAY APPARATUS AND ELECTROLUMINESCENCE DISPLAY

(71) Applicant: LG Display Co., Ltd., Seoul (KR)

(72) Inventor: JunHo Yeo, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/164,516

(22) Filed: Oct. 18, 2018

(65) Prior Publication Data

US 2019/0198582 A1    Jun. 27, 2019

(30) Foreign Application Priority Data

Dec. 27, 2017 (KR) .................. 10-2017-0180390

(51) Int. Cl.
*H01L 27/32* (2006.01)
*H01L 21/66* (2006.01)
*G09G 3/32* (2016.01)

(52) U.S. Cl.
CPC .......... *H01L 27/3223* (2013.01); *H01L 22/32* (2013.01); *H01L 27/3258* (2013.01); *H01L 27/3276* (2013.01); *G09G 3/32* (2013.01); *G09G 2300/0408* (2013.01)

(58) Field of Classification Search
CPC ....... H01L 22/32; H01L 22/34; H01L 27/124; H01L 27/1259; H01L 27/3223; H01L 27/3258; H01L 27/3276; H01L 51/524; H01L 51/5253
See application file for complete search history.

(56) References Cited

U.S. PATENT DOCUMENTS

| | | | | |
|---|---|---|---|---|
| 2010/0295045 A1* | 11/2010 | Yoshino | .................. | H01L 22/32 257/48 |
| 2013/0248863 A1* | 9/2013 | Tang | ........................ | H01L 22/30 257/48 |
| 2015/0200146 A1* | 7/2015 | Reber | ...................... | H01L 22/34 257/506 |
| 2017/0053832 A1* | 2/2017 | Wan | ......................... | H01L 21/78 |

* cited by examiner

*Primary Examiner* — David C Spalla
(74) *Attorney, Agent, or Firm* — Fenwick & West LLP

(57) ABSTRACT

Disclosed is a display apparatus that may include a substrate including a display area and a non-display area adjacent to the display area, a thin film transistor disposed in the display area, an integrated driver disposed in the non-display area and electrically connected with the thin film transistor, a plurality of test lines connected with the integrated driver and spaced apart from each other, and an opening portion configured to expose an upper surface of the substrate and obtained by removing a plurality of inorganic insulating layers disposed in the area between the plurality of test lines.

20 Claims, 6 Drawing Sheets

DISPLAY APPARATUS AND ELECTROLUMINESCENCE DISPLAY

CROSS REFERENCE TO RELATED APPLICATIONS

This application claims priority to Republic of Korea Patent Application No. 10-2017-0180390 filed on Dec. 27, 2017 with the Korean Intellectual Property Office, which is hereby incorporated by reference in its entirety.

BACKGROUND

Field of Technology

Embodiments of the present disclosure relate to an electroluminescence display, and more particularly, to a display apparatus and electroluminescence display capable of preventing damages or cracks in a display panel for a laser trimming process.

Discussion of the Related Art

Recently, various display apparatuses have been developed and utilized, for example, a liquid crystal display (LCD), an electroluminescence display (EL) such as an organic light emitting display (OLED) and a quantum dot light emitting display (QLED), and an electrophoretic display (ED).

The electroluminescence display (EL) is a self light emitting display apparatus. The electroluminescence display (EL) is provided with a cathode for injecting an electron and an anode for injecting a hole. When the electron generated in the cathode and the hole generated in the anode are injected into the inside of an emission layer, exciton is produced by a bond of the electron and hole. Then, when the exciton falls to a ground state from an excited state, the electroluminescence display (EL) emits light.

According to a light emission direction, the electroluminescence display (EL) may be classified into a top emission type, a bottom emission type, and a dual emission type. According to a driving method, the electroluminescence display (EL) may be classified into a passive matrix type and an active matrix type.

The electroluminescence display (EL) may be fabricated at a lightweight and slim size as it does not need a separate light source unlike a liquid crystal display (LCD). Also, the electroluminescence display (EL) is favorable in view of power consumption due to low voltage driving and also is excellent for color realization, a response speed, a viewing angle, and a contrast ratio (CR), whereby the electroluminescence display (EL) has been studied as a display for next generation.

The electroluminescence display (EL) may be designed to various shapes in accordance with the usage environment and purpose. For example, the electroluminescence display (EL) may be fabricated in various shapes from a typical rectangular shape to circular or oval shapes with a partially curved surface or a differentiated portion such as a notch portion.

If the display apparatus has the display panel having the differentiated portion or the circular or oval shaped display panel, it is possible to improve the degree of freedom in aspect of design, which appeals to customers who value the design of product.

In order to obtain the display panel having the differentiated portion, it inevitably requires a laser trimming process. When the display panel is treated with the laser trimming process, cracks might occur in an insulating layer on a substrate of the display panel. In this case, moisture might permeate through the cracks.

SUMMARY

An electroluminescence display is vulnerable to moisture. Thus, if moisture permeates into the inside of the electroluminescence display, a metal electrode of the electroluminescence display is oxidized or an emission layer is deformed so that it may cause problems of shortened life span and deterioration of picture quality such as pixel shrinkage and dark spot.

As the boundary surface between the metal electrode and the emission layer is oxidized or deformed by the moisture permeation, it may cause the pixel shrinkage, that is, the edge of pixel firstly becomes black-colored. If the pixel shrinkage is maintained for a long time, the entire pixel area becomes black-colored, which causes the dark spot, to thereby deteriorate reliability of the electroluminescence display.

In the related art electroluminescence display, moisture may permeate through damaged portions or cracks generated for a process of manufacturing the electroluminescence display having a display panel with a differentiated portion or a circle or oval shaped display panel, whereby it may cause problems related with deterioration of picture quality such as pixel shrinkage or dark spot. In order to overcome these problems, various methods have been studied.

In order to realize the display panel having the differentiated portion, a trimming process using laser may be carried out in the display panel. In this case, the inventors have invented an electroluminescence display which facilitates to reduce damages or cracks in an inorganic insulating layer on a substrate of a display panel.

In order to prevent damages or cracks in the display panel for the trimming process, an opening portion may be formed by removing inorganic insulating layers on a trimming line of the display panel. In this case, the inventors have invented an electroluminescence display which is capable of preventing a separation of an inorganic insulating layer.

Accordingly, embodiments of the present disclosure are directed to an electroluminescence display that substantially obviates one or more problems due to limitations and disadvantages of the related art.

An aspect of embodiments of the present disclosure is directed to provide an electroluminescence display which facilitates to form an opening portion by removing an inorganic insulating layer on a trimming line of a display panel, to thereby prevent damages or cracks in an insulating layer on a substrate of the display panel.

Another aspect of embodiments of the present disclosure is directed to provide an electroluminescence display in which an opening portion is formed by removing an inorganic insulating layer on a trimming line so as to prevent damages or cracks in a display panel for a trimming process, and an organic film is disposed in the edge of the opening portion, to thereby prevent moisture from being permeated into the inorganic insulating layer exposed in the opening portion.

To achieve these and other advantages and in accordance with the purpose of embodiments of the disclosure, as embodied and broadly described herein, there is provided an electroluminescence display that may include a substrate including a display area and a non-display area adjacent to the display area, a thin film transistor disposed in the display area, an integrated driver disposed in the non-display area and electrically connected with the thin film transistor, a plurality of test lines connected with the integrated driver and spaced apart from each other; and an opening portion configured to expose an upper surface of the substrate and obtained by removing a plurality of inorganic insulating layers disposed in the area between the plurality of test lines.

In another aspect of an embodiment of the present disclosure, there is provided an electroluminescence display device that may include a substrate having a display area and a non-display area, a thin film transistor disposed on the display area, and a light emitting diode connected with the thin film transistor under the condition that a protection insulating layer and a first planarization layer are interposed in-between, wherein the non-display area includes an integrated driver electrically connected with the thin film transistor of the display area, a plurality of test lines connected with the integrated driver and extending to the outermost line of the substrate, and an opening portion overlapped with the outermost line of the substrate, and configured to expose an upper surface of the substrate by removing a plurality of inorganic insulating layers disposed in the area between the plurality of test lines spaced apart from each other.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
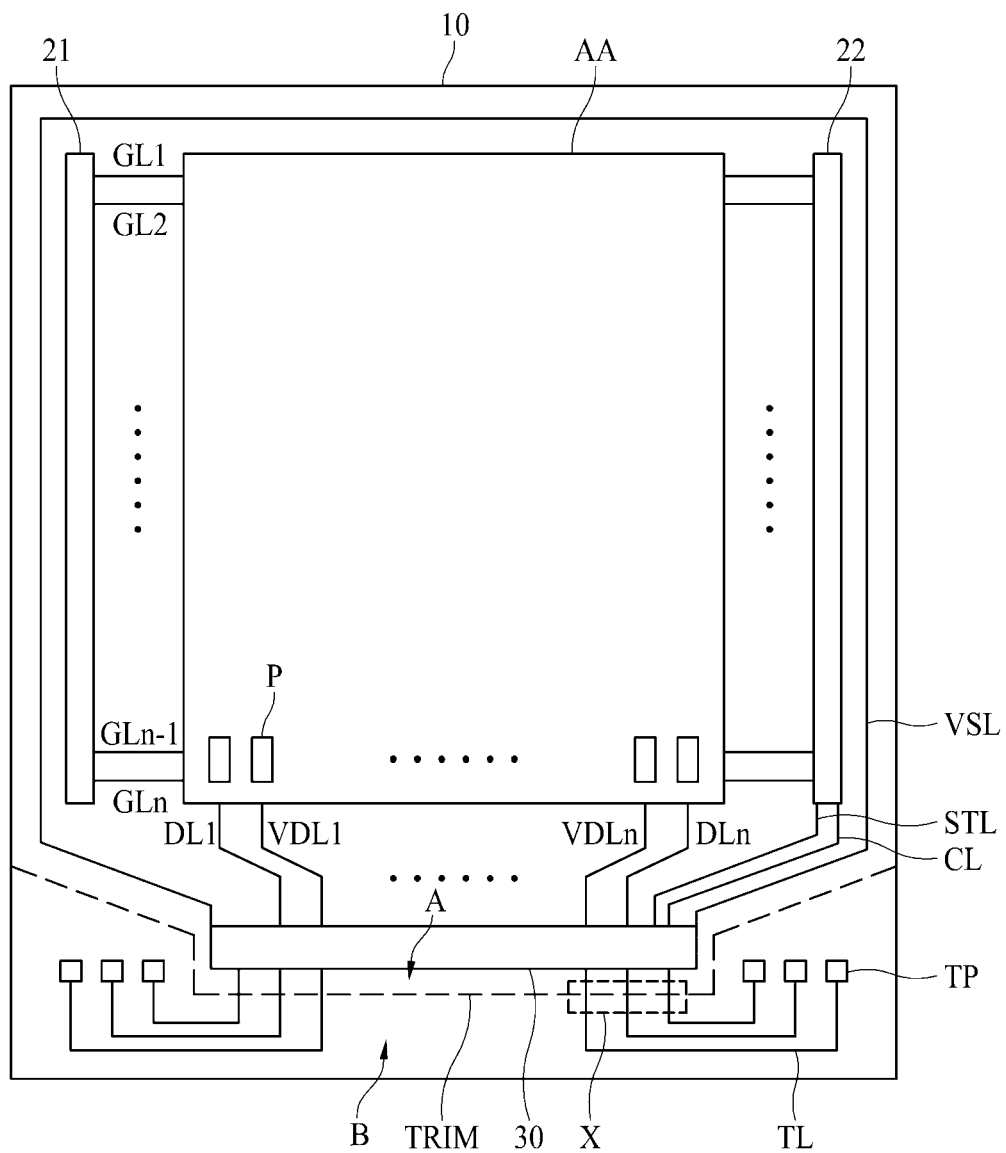
FIG. 1 is a block diagram illustrating an electroluminescence display, according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just~' or 'direct~' is used.

In describing a time relationship, for example, when the temporal order is described as 'after~', 'subsequent~', 'next~', and 'before~', a case which is not continuous may be included unless 'just~' or 'direct~' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an electroluminescence display according to the embodiment of the present disclosure will be described with reference to the accompanying drawings.

Figure 2:
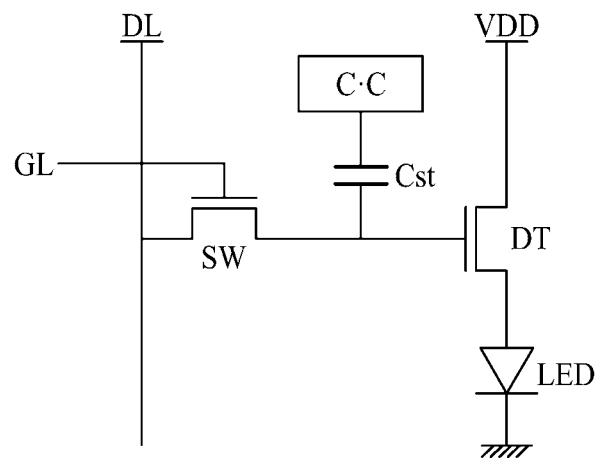
FIG. 2 is a circuit diagram illustrating a pixel (P) structure shown in FIG. 1, according to an embodiment of the present disclosure.
Figure 3:
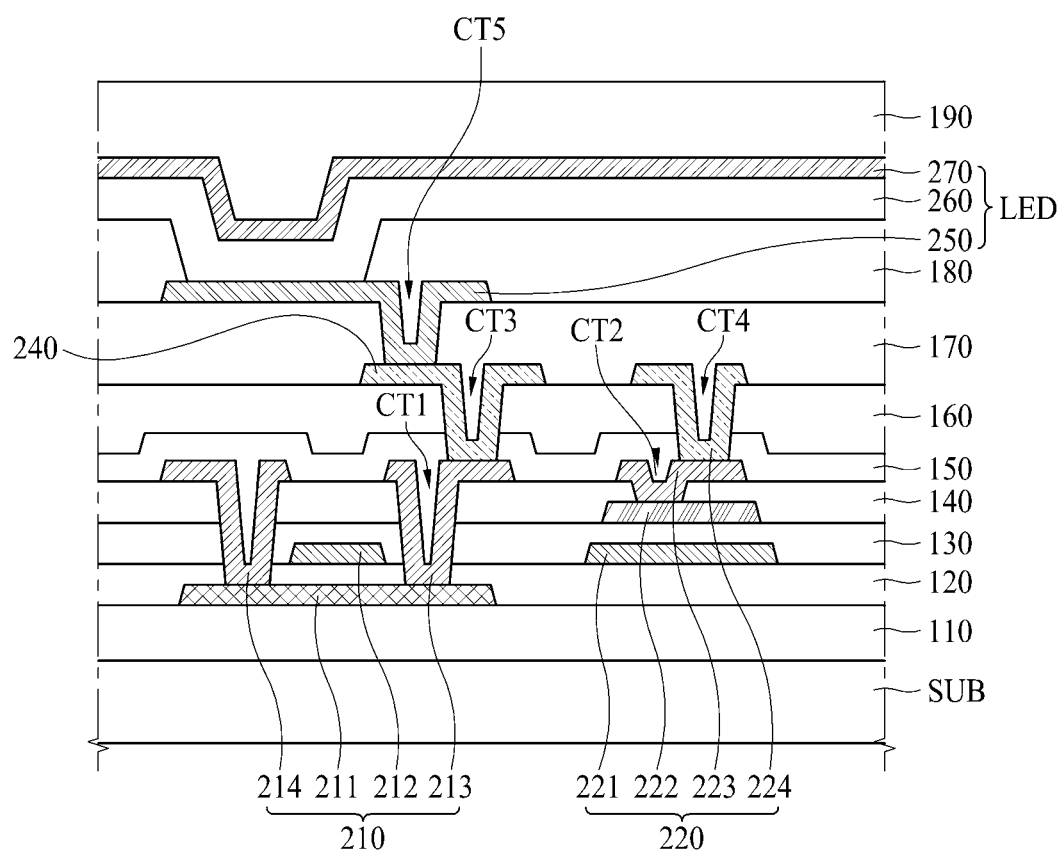
FIG. 3 is a cross sectional view illustrating a pixel (P) structure shown in FIG. 1, according to an embodiment of the present disclosure.

FIG. 1 is a block diagram illustrating an electroluminescence display according to an embodiment of the present disclosure. FIG. 2 is a circuit diagram illustrating a pixel (P) structure shown in FIG. 1. FIG. 3 illustrates a cross sectional view illustrating a thin film transistor, a storage capacitor, and a light emitting diode in a pixel (P) of FIG. 1.

Referring to FIG. 1, the electroluminescence display according to the embodiment of the present disclosure may include a display panel 10, a first gate driver 21, a second gate driver 22, and an integrated driver 30. The integrated driver 30 may include a data driver, a level shifter, and a timing controller.

The display panel 10 may include a display area (AA) for displaying information, and a non-display area except the display area (AA) of the display panel 10. The non-display area may be defined as an area on which information is not displayed. The display area (AA) may be an area on which an input image is displayed, and may be defined as an area on which a plurality of pixels (P) are arranged in a matrix configuration.

The display area (AA) including data lines (D1~Dn, is an integer of 2 or more than 2), gate lines (G1~Gn, 'in' is an integer of 2 or more than 2) and pixels (P) may be formed on the display panel 10. The data lines (D1~Dn) may be perpendicular to the gate lines (G1~Gn). The pixel (P) may be connected with any one of the data lines (D1~Dn) and any one of the gate lines (G1~Gn). The first gate driver 21, the second gate driver 22 and the integrated driver 30 may be arranged in the non-display area. The data driver, the level shifter and the timing controller may be formed as one integrated circuit (IC), as shown in the integrated driver 30 of FIG. 1, but not limited thereto. For example, each of the data driver, the level shifter and the timing controller may be formed as an individual integrated circuit. The integrated driver 30 may be directly placed onto the display panel 10 by a chip on glass (COG) method or a chip on plastic (COP) method.

In the non-display area, there are gate link lines (GL1~GLn) for electrically connecting the first and second gate drivers 21 and 22 with the gate lines (G1~Gn) arranged in the display area (AA), and data link lines (DL1~DLn) for electrically connecting the integrated driver 30 with the data lines (D1~Dn) arranged in the display area (AA). Also, first power source link lines (VDL1~VDLn) for supplying a first power source (Vdd) corresponding a high potential voltage to the pixel (P) of the display panel 10 may be arranged in the non-display area. Also, a second power source line (VSL) for supplying a second power source (VSS) corresponding a low potential voltage to the pixel (P) of the display panel 10 may be arranged in the non-display area.

The first and second gate drivers 21 and 22 may be connected with the gate lines (G1~Gn) through the gate link lines (GL1~GLn), whereby the first and second gate drivers 21 and 22 may supply gate signals to the gate lines (G1~Gn).

The first and second gate drivers 21 and 22 may be formed on the non-display area in a gate driver in panel (GIP) method. For example, as shown in FIG. 1, the first gate driver 21 may be disposed adjacent one side of the display area (AA), and the second gate driver 22 may be disposed adjacent to the other side of the display area (AA). It is possible to omit any one of the first and second gate drivers 21 and 22. In this case, one gate driver may be disposed adjacent to one side of the display area (AA).

The level shifter may level-shift voltage levels of a start voltage and clock signals which are provided from the timing controller to a gate-on voltage (Von) and a gate-off voltage (Voff) capable of switching a thin film transistor formed in the display panel 10. The level shifter may supply the level-shifted clock signals to the first and second gate drivers 21 and 22 through a clock line (CL), and may supply the level-shifted start signal to the first and second gate drivers 21 and 22 through a start line (STL). The clock line (CL) and the start line (STL) correspond to lines for transmitting the start signal and the clock signals corresponding to a gate control signal. In this disclosure, the clock lines (CL) and the start line (STL) may be referred to as a gate control line.

The data lines (D1~Dn) may be connected with the integrated driver 30 through the data link lines (DL1~DLn). The data lines (D1~Dn) may be supplied with digital video data and a data control signal from the timing controller of the integrated driver 30. The integrated driver 30 may convert digital video data into analog data voltages in accordance with the data control signal. The integrated driver 30 may supply the analog data voltages to the data lines (D1~Dn).

The timing controller of the integrated driver 30 may be supplied with digital video data and timing signals from an external system board. The timing signals may include a vertical sync signal, a horizontal sync signal, and a data enable signal.

The timing controller of the integrated driver 30 may generate the gate control signal for controlling an operation timing of the first and second gate drivers 21 and 22 on the basis of timing signals. The timing controller of the integrated driver 30 may generate the data control signal for controlling an operation timing of the data driver in the integrated driver 30.

The display panel 10 of the electroluminescence display according to the embodiment of the present disclosure may include a test pad (TP) and a test line (TL) disposed in the non-display area. The test pad (TP) may be prepared in the periphery of a trimming line (TRIM). The plurality of test pads (TP) may be spaced apart from each other while being prepared in the periphery of the trimming line (TRIM). The plurality of test lines (TL) may be spaced apart from each other, and the plurality of test lines (TL) may be respectively connected with the plurality of test pads (TP). The trimming line (TRIM) to be performed with a trimming process may be perpendicular to the test line (TL) so that the test line (TL) is capable of being cut after a lighting test process.

The test line (TL) may electrically connect the integrated driver 30 and the test pad (TP) with each other. The test line (TL) connects the integrated driver 30 and the test pad (TP) with each other so as to perform the lighting test process in the pixel (P) formed in the display area (AA) of the display panel 10, wherein the test line (TL) is not used as a signal line after the lighting test process of the pixel (P).

The test pad (TP) may be separated from the display panel 10 by the trimming process. The test line (TL) may be cut by the trimming process.

According as the display panel 10 is cut along the trimming line (TRIM) defined on the display panel 10 by the trimming process, as shown in FIG. 1, it is possible to manufacture an electroluminescence display having a differentiated display panel with a notch portion. The test pad (TP) disposed in the periphery of the trimming line (TRIM) may be removed by the trimming process. The trimming line (TRIM) defined on the display panel 10 is perpendicular to the test line (TL) so that the test line (TL) may be cut by the trimming process.

In the electroluminescence display according to the embodiment of the present disclosure, inorganic insulating layers disposed in an area between each of the plurality of test lines (TL) which are cut by the trimming process in the non-display area of the display panel 10 are removed so that it is possible to prevent damages or cracks in the display panel 10. For example, the inorganic insulating layer disposed in the crossing area of the test line (TL) and the trimming line (TRIM) to be performed with the trimming process is removed from the area between each of the plurality of test lines (TL) spaced apart from each other so that it is possible to prevent the inorganic insulating layer from being damaged or cracked by the trimming process and to prevent moisture from being permeated through the cracks generated in the inorganic insulating layer. The process of removing the inorganic insulating layer from the area corresponding to the trimming line (TRIM) will be described in detail with reference to FIG. 4 and FIGS. 5A and 5B.

In the electroluminescence display according to the embodiment of the present disclosure, the display panel 10 may include a power source supply portion for generating a plurality of power source voltages such as the first power source (VDD) and second power source (VSS) for driving the pixels (P), gate driving voltages such as the gate-on voltage (Von) and the gate-off voltage (Voff) for driving the first and second gate drivers 21 and 22, a source driving voltage for driving the data driver, and a control driving voltage for driving the timing controller.

FIG. 2 is a circuit diagram illustrating the pixel (P) structure of the electroluminescence display.

Referring to FIG. 2, each pixel (P) may include a switching transistor (SW), a driving transistor (DT), a compensation circuit (CC), and a light emitting diode (LED). The light emitting diode (LED) is driven to emit light in accordance with a driving current formed by the driving transistor (DT). In the pixel (T) structure, the light emitting diode may include an inorganic light emitting diode such as an organic light emitting diode (OLED) or a quantum dot light emitting diode (QLED).

The switching transistor (SW) may store the data voltage, which is supplied from the data lines (D1~Dn), in the storage capacitor (Cst) in response to a gate pulse supplied through the gate lines (G1~Gn). The driving transistor (DT) controls an amount of current supplied to the light emitting diode (LED) in accordance with a level of voltage charged in the storage capacitor (Cst), to thereby control a light emission level of the light emitting diode (LED). A brightness of the light emission in the light emitting diode (LED) may be proportional to the driving current supplied from the driving transistor (DT).

The compensation circuit (CC) compensates for mobility and threshold voltage of the driving transistor (DT), wherein the compensation circuit (CC) may be obtained by combining at least one thin film transistor, but not limited to this structure.

In the display panel 10 of the electroluminescence display according to the embodiment of the present disclosure, the pixel (P) may be supplied with the first power source (VDD) corresponding to the high-potential voltage through the first power source lines (VDL1~VDLn), and may be supplied with the second power source (VSS) corresponding to the low-potential voltage through the second power source line (VSL).

The thin film transistor (TFT) for the pixel (P) may be formed in a p-type or n-type. A semiconductor layer for the TFT for the pixel (P) may include amorphous silicon, poly silicon, or oxide. The light emitting diode (LED) may include a light emission structure interposed between an anode electrode and a cathode electrode. The anode electrode may be connected with the driving transistor (DT). The light emission structure may include an emission layer (EML), wherein a hole injection layer (HIL) and a hole transport layer (HTL) may be disposed at one side with respect to the emission layer (EML), and an electron transport layer (ETL) and an electron injection layer (EIL) may be disposed at the other side with respect to the emission layer (EML).

The circuit diagram of the pixel (P) structure shown in FIG. 2 shows an embodiment of the electroluminescence display, but not limited to the example of the circuit diagram shown in FIG. 2.

FIG. 3 is a cross sectional view of the pixel (P) shown in FIG. 1. In FIG. 3, the pixel (P) of the display panel 10 includes the light emitting diode (LED) having an anode electrode 250, an emission structure 260, and a cathode electrode 270.

Referring to FIG. 3, a buffer insulating layer 110 may be disposed on one surface of a substrate (SUB). The substrate (SUB) may be a plastic film or a glass substrate, but not limited thereto. The buffer insulating layer 110 may be formed on one surface of the substrate (SUB) so as to protect the thin film transistors 210 and the emission structures 260 from a moisture permeation, wherein moisture may permeate through the substrate (SUB) which is vulnerable to moisture. The buffer insulating layer 110 may be formed of a single-layered structure or a multi-layered structure by alternately depositing a plurality of inorganic films. The buffer insulating layer 110 may be formed of an inorganic insulating layer. For example, the buffer insulating layer 110 may be formed of in single-layered structure of silicon oxide film (SiOx) or silicon nitride film (SiNx), or a multi-layered structure of silicon oxide film (SiOx) and silicon nitride film (SiNx). According to the kind and material of the substrate (SUB), and the structure and properties of the thin film transistor 210, it is possible to omit the buffer insulating layer 110.

Then, the thin film transistor 210 and capacitor 220 may be formed on the buffer insulating layer 110.

The thin film transistor 210 may include an active layer 211, a gate electrode 212, a source electrode 213, and a drain electrode 214. FIG. 3 shows a top gate method where the gate electrode 212 of the thin film transistor 210 is disposed above the active layer 211, but not limited to the top gate method. For example, the thin film transistor 210 may be formed in a bottom gate method where the gate electrode 212 is disposed below the active layer 211, or a double gate method where the gate electrode 212 is disposed both above and below the active layer 211.

The capacitor 220 may include a first capacitor electrode 221, a second capacitor electrode 222, a third capacitor electrode 223, and a fourth capacitor electrode 224.

As shown in FIG. 3, the active layer 211 may be disposed on the buffer insulating layer 110. The active layer 211 may be formed of a silicon-based semiconductor material or an oxide-based semiconductor material. Between the buffer insulating layer 110 and the active layer 211, there may be an additionally-provided light shielding layer for shielding ambient light which is incident on the active layer 211.

The gate insulating layer 120 may be formed on the active layer 211. The gate insulating layer 120 may be an inorganic insulating layer. For example, the gate insulating layer 120 may be formed of in single-layered structure of silicon oxide film (SiOx) or silicon nitride film (SiNx), or a multi-layered structure of silicon oxide film (SiOx) and silicon nitride film (SiNx).

The gate electrode 212 of the thin film transistor 210 and the first capacitor electrode 221 of the capacitor 220 may be disposed on the gate insulating layer 120. The gate electrode 212 and the first capacitor electrode 221 may be formed of a conductive metal material. For example, the first capacitor electrode 221 may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys. The gate electrode 212 may be disposed on the gate insulating layer 112 while being overlapped with the active layer 211.

The gate electrode 212 of the thin film transistor 210 and the first capacitor electrode 221 of the capacitor 220 may be manufactured by the same process, may be formed in the same thickness, and may be formed of the same material.

A first interlayer insulating layer 130 may be disposed on the gate electrode 212 and the first capacitor electrode 221. The first interlayer insulating layer 130 may be formed of an inorganic insulating material. For example, the first interlayer insulating layer 130 may be formed of in a single-layered structure of silicon oxide film (SiOx) or silicon nitride film (SiNx), or a multi-layered structure of silicon oxide film (SiOx) and silicon nitride film (SiNx).

The second capacitor electrode 222 may be disposed on the first interlayer insulating layer 130. The second capacitor electrode 222 may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

A second interlayer insulating layer 140 may be disposed on the second capacitor electrode 222. The second interlayer insulating layer 140 may be formed of an inorganic insulating material. For example, the first interlayer insulating layer 130 may be formed of in a single-layered structure of silicon oxide film (SiOx) or silicon nitride film (SiNx), or a multi-layered structure of silicon oxide film (SiOx) and silicon nitride film (SiNx).

The drain electrode 213, the source electrode 214, and the third capacitor electrode 223 may be disposed on the second interlayer insulating layer 140. The source electrode 214 and the drain electrode 213 of the thin film transistor 210 may be connected with the active layer 211 via a first contact hole (CT1) penetrating through the gate insulating layer 120, the first interlayer insulating layer 130, and the second interlayer insulating layer 140. The third capacitor electrode 223 of the capacitor 220 may be connected with the second capacitor electrode 222 via a second contact hole (CT2) penetrating through the second interlayer insulating layer 140. The source electrode 214, the drain electrode 213, and the third capacitor electrode 223 may be formed of a conductive metal material. For example, each of the source electrode 214, the drain electrode 213, and the third capacitor electrode 223 may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

The source electrode 214 and the drain electrode 213 of the thin film transistor 210, and the third capacitor electrode 223 of the capacitor 220 may be manufactured by the same process, may be formed in the same thickness, and may be formed of the same material.

A protection insulating layer 150 may be disposed on the source electrode 214, the drain electrode 213, and the third capacitor electrode 223. The protection insulating layer 150 may be formed of an inorganic insulating material. For example, the protection insulating layer 150 may be formed of in a single-layered structure of silicon oxide film (SiOx) or silicon nitride film (SiNx), or a multi-layered structure of silicon oxide film (SiOx) and silicon nitride film (SiNx).

A first planarization layer 160 may be disposed on the protection insulating layer 150, wherein the first planarization layer 160 may compensate for a step difference caused by the thin film transistor 210 and the capacitor 220. The first planarization layer 160 may be formed of an organic insulating material layer. For example, the first planarization layer 160 may be formed of an organic material layer such as acryl resin, epoxy resin, phenolic resin, polyamide resin, or polyimide resin.

An anode auxiliary electrode 240 and the fourth capacitor electrode 224 may be disposed on the first planarization layer 160. The anode auxiliary electrode 240 may be connected with the drain electrode 213 of the thin film transistor 210 via a third contact hole (CT3) penetrating through the protection insulating layer 150 an the first planarization layer 160. The fourth capacitor electrode 224 may be connected with the third capacitor electrode 223 via a fourth contact hole (CT4) penetrating through the protection insulating layer 150 and the first planarization layer 160. The anode auxiliary electrode 240 and the fourth capacitor electrode 224 may be formed of a conductive metal material. For example, the anode auxiliary electrode 240 and the fourth capacitor electrode 224 may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

A second planarization layer 170 may be disposed on the anode auxiliary electrode 240 and the fourth capacitor electrode 224. The second planarization layer 170 may be formed of an organic insulating material layer. For example, the second planarization layer 170 may be formed of an organic material layer such as acryl resin, epoxy resin, phenolic resin, polyamide resin, or polyimide resin.

The second planarization layer 170 and the anode auxiliary electrode 240 may be omittable in accordance with the properties of the display panel 10 of the electroluminescence display. For example, if not providing the second planarization layer 170 and the anode auxiliary electrode 240, the anode electrode 250 may be formed on the first planarization layer 160, and the anode electrode 250 may be electrically connected with the drain electrode 213 of the thin film transistor 210 via the contact hole of the first planarization layer 160 and the second interlayer insulating layer 150.

The light emitting diode (LED) and a bank 180 may be disposed on the second planarization layer 170. The light emitting diode (LED) may include the anode electrode 250, the emission structure 260, and the cathode electrode 270.

The anode electrode 250 may be disposed on the second planarization layer 170. The anode electrode 250 may be connected with the anode auxiliary electrode 240 via a fifth contact hole (CT5) penetrating through the second planarization layer 170. The anode electrode 250 may be formed of aluminum (Al), argentums (Ag), molybdenum (Mo), a deposition structure (Mo/Ti) of molybdenum and titanium, a deposition structure (Ti/Al/Ti) of aluminum and titanium, a deposition structure (ITO/Al/ITO) of aluminum and ITO, APC alloy, or a deposition structure (ITO/APC/ITO) of APC alloy and ITO. Herein, the APC ally corresponds to the alloy of argentums (Ag), palladium (Pd) and copper (Cu).

The bank 180 may cover the edge of the anode electrode 250, whereby an emission area of the pixel (P) may be defined by the bank 180. The emission area of the pixel (P) may be obtained by depositing the anode electrode 250, the emission structure 260 and the cathode electrode 270, wherein the hole provided from the anode electrode 250 and the electron provided from the cathode electrode 270 are bonded to each other in the emission area so as to emit light.

In this case, the area provided with the bank 180 may be defined as the non emission area. The bank 180 may be formed of an organic material layer such as acryl resin, epoxy resin, phenolic resin, polyamide resin, or polyimide resin.

The emission structure 260 may be disposed on the anode electrode 250 and the bank 180. The emission structure 260 may be a common layer formed for the pixels (P) in common, wherein the emission structure 260 may be a white light emitting structure for emitting white light. In this case, the emission structure 260 may be formed in a tandem structure having at least 2 stacks. Each stack may include a hole transporting layer, at least one light emitting layer, and an electron transporting layer. Also, a charge generating layer may be disposed between the stacks.

The hole transporting layer enables a smooth transfer of the hole, which is injected from the anode electrode 250 or charge generating layer, to the light emitting layer. The light emitting layer may be formed of an organic material having a phosphorescent or fluorescent material, to thereby emit light. The electron transporting layer enables a smooth transfer of the electron, which is injected from the cathode electrode 270 or charge generating layer, to the light emitting layer.

The charge generating layer may include an n-type charge generating layer positioned adjacent to a lower stack, and a p-type charge generating layer positioned adjacent to an upper stack. The n-type charge generating layer injects the electron to the lower stack, and the p-type charge generating layer injects the hole to the upper stack. The n-type charge generating layer may be formed by doping an organic host material having an electron transporting capacity with alkali-based metal such as lithium (Li), natrium (Na), kalium (K) or cesium (Cs), or alkali earth metal such as magnesium (Mg), strontium (Sr), barium (Ba) or radium (Ra), but not limited to these materials. The P-type charge generating layer may be formed by doping an organic host material having a hole transporting capacity with dopant.

In FIG. 3, the emission structure 260 may be a common layer formed for the pixels (P) in common, and the emission structure 260 may be the white light emitting structure for emitting white light, but not limited to this structure. For example, the light emitting layer of the emission structure 260 may be formed by each pixel (P). In this case, the light emitting layer of the emission structure 260 may be classified into a red pixel including a red light emitting layer for emitting red light, a green pixel including a green light emitting layer for emitting green light, and a blue pixel including a blue light emitting layer for emitting blue light.

The cathode electrode 270 may be disposed on the emission structure 260. The cathode electrode 270 may be a common layer formed for the pixels (P) in common. The cathode electrode 270 may be formed of a transparent conductive material (TCO) such as ITO or IZO capable of transmitting light therethrough, or a semi-transmissive conductive material such as magnesium (Mg), argentums (Ag) or alloy of magnesium (Mg) and argentums (Ag). If the cathode electrode 270 is formed of the semi-transmissive conductive material, it is possible to improve a light emission efficiency by a micro cavity. A capping layer may be additionally disposed on the cathode electrode 270.

An encapsulation structure 190 may be disposed on the cathode electrode 270. The encapsulation structure 190 prevents moisture or oxygen from being permeated into the emission structure 260 and the cathode electrode 270. The encapsulation structure 190 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. Also, the encapsulation structure 190 may further include at least one organic film for preventing particles from being permeated into the emission structure 260 and the cathode electrode 270 through the inorganic film.

Figure 4:
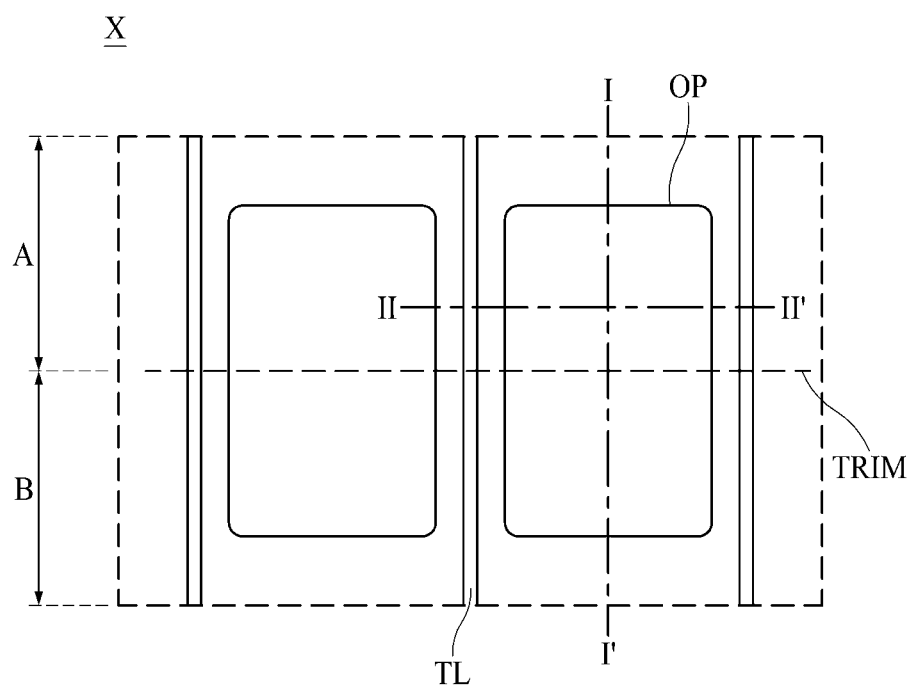
FIG. 4 is an enlarged plane view illustrating 'X' of FIG. 1, according to an embodiment of the present disclosure.
Figure 5A:
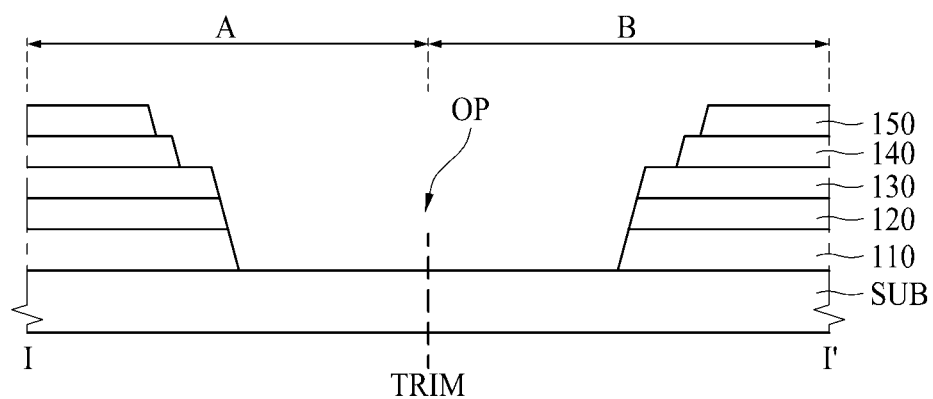
FIG. 5A is a cross sectional view along I-I' of FIG. 4, according to an embodiment of the present disclosure.
Figure 5B:
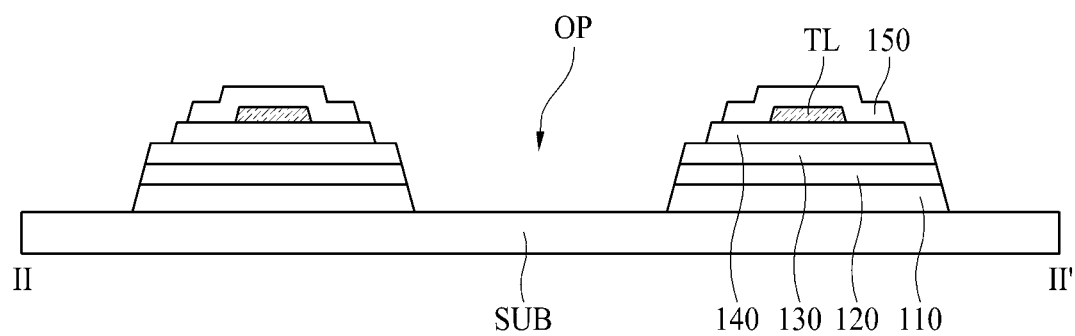
FIG. 5B is a cross sectional view along II-II' of FIG. 4, according to an embodiment of the present disclosure.

FIG. 4 is an enlarged plane view illustrating 'X' of FIG. 1. FIG. 4 is a plane view for explaining a detailed plane structure of 'X' in the display panel 10 of the electroluminescence display according to the embodiment of the present disclosure. FIG. 5A is a cross sectional view along I-I' of FIG. 4. FIG. 5B is a cross sectional view along II-II' of FIG. 4.

Referring to FIG. 4, the display panel 10 of the electroluminescence display according to the embodiment of the present disclosure may include an opening portion (OP) which is formed by removing the plurality of inorganic insulating layers corresponding to the area between the plurality of test lines (TL) spaced apart from each other in the non-display area.

In the non-display area which is close to the display area (DA), the plurality of test lines (TL) may be spaced apart from each other. The plurality of test lines (TL) may connect the integrated driver 30 and the test pad (TP) with each other.

The trimming line (TRIM) may cross the plurality of test lines (TL). The plurality of test lines (TL) which cross the trimming line (TRIM) may be cut by the trimming process.

The trimming process may be performed by the use of laser. The display panel 10 may be manufactured in various shapes by the laser trimming process, for example, a rectangular shape with partial curved surfaces or differentiated portions such as notch portions, a circular shape, an oval shape, and etc.

Referring to FIGS. 1 and 4, the non-display area of the display panel 10 may be divided into a first area (A) and a second area (B) with respect to the trimming line (TRIM). The second area (B) may be removed. For example, the test line (TL) and the test pad (TP), which are disposed in the periphery of the trimming line (TRIM), may be removed.

The first area (A) may be the area disposed between the trimming line (TRIM) and the display area (AA). The integrated driver 30 may be disposed between the trimming line (TRIM) and the display area (AA). Accordingly, the integrated driver 30 may be disposed in the first area (A), and the second area (B) may be the peripheral area of the trimming line (TRIM).

After the trimming process, the trimming line (TRIM) may be the outermost portion of the display panel 10. As shown in FIG. 1, the second area (B) corresponding to the peripheral area of the trimming line (TRIM) is removed so that the trimming line (TRIM) may be the outermost portion having the shape of the display panel 10.

The opening portion (OP) may be formed by removing the inorganic insulating layers disposed in the area between the plurality of test lines (TL) spaced apart from each other. The opening portion (OP) may be overlapped with the trimming line (TRIM) of the display panel 10.

Referring to FIG. 5A, the buffer insulating layer 110, the gate insulating layer 120, the first interlayer insulating layer 130, the second interlayer insulating layer 140 and the protection insulting layer 150 are deposited and disposed on the substrate (SUB) in the non-display area of the display panel 10. Also, the opening portion (OP) for exposing the substrate (SUB) may be formed by removing the plurality of inorganic insulating layers in the area corresponding to the trimming line (TRIM) to be performed with the trimming process. For example, the substrate (SUB) may be cut along the trimming line (TRIM) defined on the display panel 10 by the laser trimming process. The opening portion (OP) for exposing the substrate (SUB) may be formed by removing the plurality of inorganic insulating layers such as the buffer insulating layer 110, the gate insulating layer 120, the first interlayer insulating layer 130, the second interlayer insulating layer 140 and the protection insulating layer 150 disposed in the cut area of the substrate (SUB).

Referring to FIGS. 1, 4 and 5B, the second area (B) corresponding to the peripheral area of the trimming line (TRIM) may be removed by the trimming process. The first area (A) disposed between the trimming line (TRIM) and the display area (AA) is not removed by the trimming process. According as the second area (B) is removed by the trimming process, the trimming line (TRIM) may be the outermost portion of the display panel 10. Thus, the trimming line (TRIM) may be referred to as the outermost line of the display panel 10, or the end of the substrate (SUB).

The opening portion (OP) may expose an upper surface in the end of the substrate (SUB). The opening portion (OP) may be disposed between the integrated driver 30 and the end of the substrate (SUB).

According as the opening portion (OP) for exposing the substrate (SUB) is formed by removing the inorganic insulating layers disposed in the area of the substrate (SUB) to be cut, it is possible to prevent damages or cracks in the inorganic insulating layers by the trimming process, and to prevent moisture from being permeated through the cracks of the inorganic insulating layers.

Referring to FIG. 5B, the buffer insulating layer 110, the gate insulating layer 120, the first interlayer insulating layer 130 and the second interlayer insulating layer 140 are deposited and disposed on the substrate (SUB) in the non-display area of the display panel 10. The plurality of test lines (TL) may be disposed on the second interlayer insulating layer 140. The test line (TL) may be manufactured for the process of forming the source electrode 214 and the drain electrode 213 of the thin film transistor 210. At this time, the test line (TL) is formed of the same material as that of the source electrode 214 and the drain electrode 213, and is formed at the same thickness as that of the source electrode 214 and the drain electrode 213. For example, the test line (TL) may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

The protection insulating layer 150 may be formed on the test line (TL) and the second interlayer insulating layer 140. The protection insulating layer 150 may surround both lateral surfaces and upper surface of the test line (TL) so as to protect the test line (TL).

The test line (TL) may be connected with the integrated driver 30, and may be connected with the test pad (TP) disposed in the periphery of the trimming line (TRIM). According as the substrate (SUB) is cut along the trimming line (TRIM) by the trimming process, the test pad (TP) may be removed, and the test line (TL) may be cut.

As shown in FIG. 5B, the opening portion (OP) for exposing the substrate (SUB) may be formed by removing the plurality of inorganic insulating layers disposed in the area between the plurality of test lines (TL) spaced apart from each other, for example, the buffer insulating layer 110, the gate insulating layer 120, the first interlayer insulating layer 130, the second interlayer insulating layer 140 and the protection insulating layer 150. The opening portion (OP) may be overlapped with the trimming line (TRIM).

Referring to FIGS. 1, 4, 5A and 5B, the opening portion (OP) may be disposed in the area between the plurality of test lines (TL) spaced apart from each other, and the opening portion (OP) may be disposed in the area overlapped with the trimming line (TRIM). It is possible to remove the opening portion (OP) from the second area (B) corresponding to the peripheral area of the trimming line (TL). The opening portion (OP) corresponding to the first area (A) between the trimming line (TRIM) and the display area (AA) may expose the upper surface of the substrate (SUB). Herein, the trimming line (TRIM) may be the outermost line having the shape of the display panel 10. The trimming line (TRIM) may be the end of the substrate (SUB). Accordingly, the opening portion (OP) may be disposed between the end of the substrate (SUB) and the display area (AA). The opening portion (OP) may be disposed between the end of the substrate (SUB) and the integrated driver 30.

Figure 6:
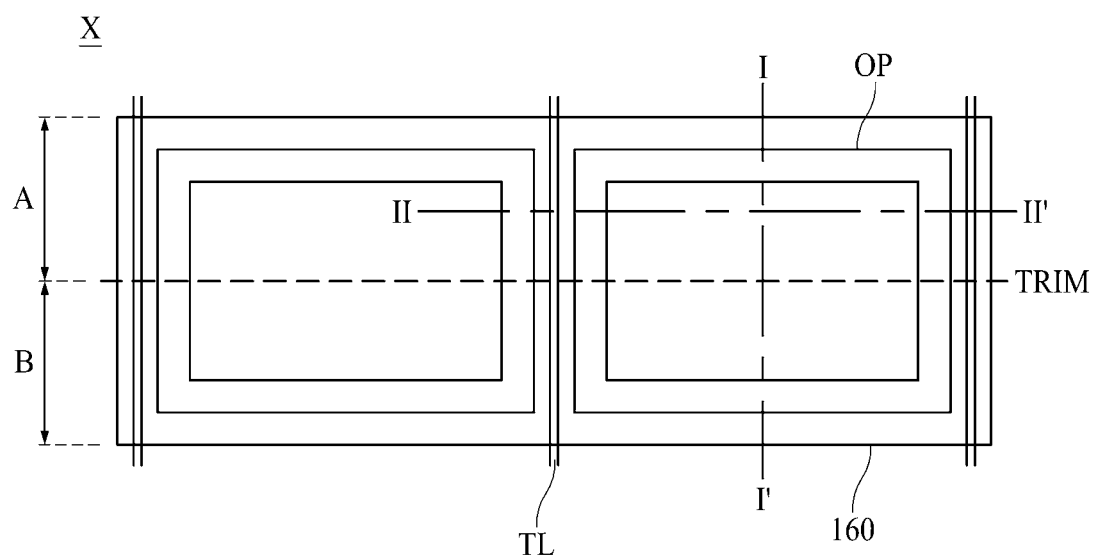
FIG. 6 is an enlarged plane view illustrating 'X' of FIG. 1, according to an embodiment of the present disclosure.
Figure 7A:
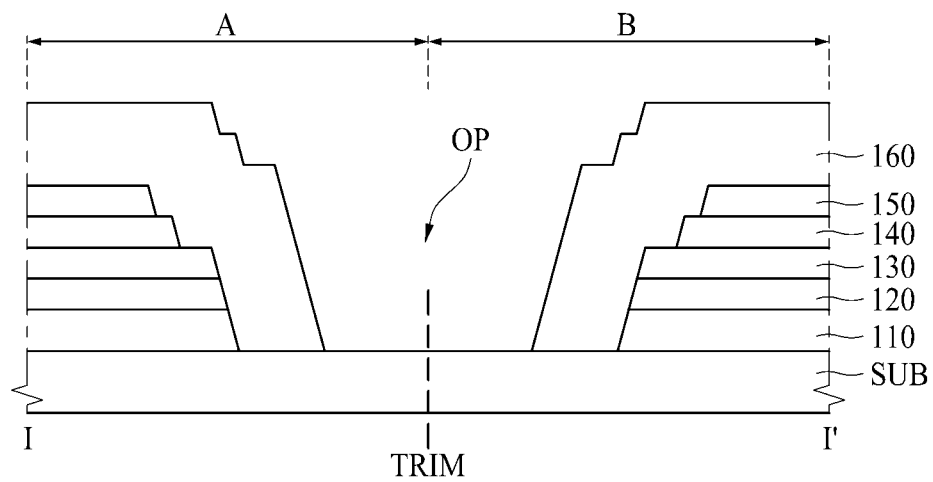
FIG. 7A is a cross sectional view along I-I' of FIG. 6, according to an embodiment of the present disclosure.
Figure 7B:
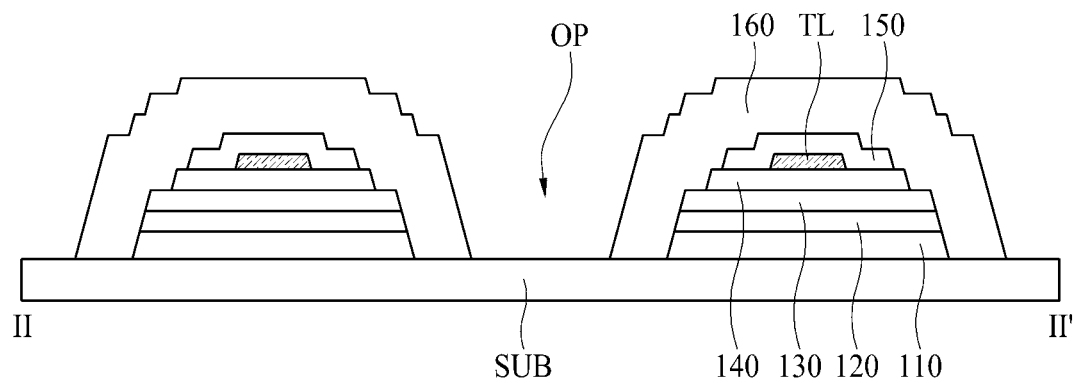
FIG. 7B is a cross sectional view along II-II' of FIG. 6, according to an embodiment of the present disclosure.

FIG. 6 is an enlarged plane view illustrating 'X' of FIG. 1. FIG. 6 is a plane view for explaining a detailed plane structure of 'X' in the display panel 10 of the electroluminescence display according to another embodiment of the present disclosure. FIG. 7A is a cross sectional view along I-I' of FIG. 6. FIG. 7B is a cross sectional view along II-II' of FIG. 6. The detailed plane structure of 'X' in the display panel 10 of the electroluminescence display according to another embodiment of the present disclosure will be described with reference to FIGS. 4, 5A and 5B, wherein a detailed description for the same parts will be omitted or will be described in brief.

Referring to FIG. 6, a display panel 10 may include a first planarization layer 160 for covering an edge of an opening portion (OP) disposed between a plurality of test lines (TL) spaced apart from each other, but not limited to this structure. For example, a second planarization layer 170 may be formed to cover the edge of the opening portion (OP), or first and second planarization layers 160 and 170 may be formed to cover the edge of the opening portion (OP).

A second area (B) corresponding to a peripheral area of a trimming line (TRIM) may be removed by a trimming process. Thus, it is possible to remove a test line (TL) and an opening portion (OP) corresponding to the second area (B). According as the display panel 10 is cut by the trimming process, the trimming line (TRIM) may be the outermost line of the display panel 10. Herein, the opening portion (OP) and the test line (TL) corresponding to the first area (A) which is the interior area of the trimming line (TRIM), for example, the area between the trimming line (TRIM) and the display area (AA) are not removed. For example, as shown in FIGS. 1 and 6, the opening portion (OP) may be disposed while being overlapped with the trimming line (TRIM) corresponding to the outermost line of the display panel 10. The second area (B) is removed by the trimming process, and the first area (A) is not removed. The opening portion (OP) formed between each test line (TL) in the first area (A) may expose the substrate (SUB).

Referring to FIG. 7A, the opening portion (OP) may expose an upper surface of the substrate (SUB) corresponding to the outermost line of the display panel 10. An organic film for preventing moisture permeation in the boundary surface between the substrate (SUB) and a buffer insulating layer 110 may be disposed in the opening portion (OP). For example, the first planarization layer 160 for covering the boundary surface between the substrate (SUB) and the buffer insulating layer 110 in the opening portion (OP) may be disposed, but not limited to this structure. Also, the second planarization layer 170 may be disposed to cover the area between the substrate (SUB) and the buffer insulating layer 110 in the opening portion (OP).

Referring to FIG. 7B, an organic film may be disposed to cover each of the plurality of test lines (TL) spaced apart from each other. For example, the first planarization layer 160 may be disposed on a protection insulating layer 150 over the test line (TL). The organic film may cover lateral surfaces of a plurality of inorganic insulating layers in the opening portion (OP). The organic film covers the boundary surface between the substrate (SUB) and the lowermost insulating layer among the plurality of inorganic insulating layers. In the opening portion (OP), as shown in FIG. 7B, the first planarization layer 160 may cover lateral surfaces of the plurality of inorganic insulating layers, for example, the buffer insulating layer 110, a gate insulating layer 120, a first interlayer insulating layer 130, a second interlayer insulating layer 140 and the protection insulating layer 150. The first planarization layer 160 may cover the boundary surface between the substrate (SUB) and the buffer insulating layer 110 corresponding to the lowermost insulating layer. The first planarization layer 160 may cover the edge of the opening portion (OP).

In FIGS. 7A and 7B, the first planarization layer 160 covers the edge of the opening portion (OP). However, the second planarization layer 170 may be provided to cover the edge of the opening portion (OP). For example, in the opening portion (OP), the second planarization layer 170 may cover lateral surfaces of the plurality of inorganic insulating layers, for example, the buffer insulating layer 110, the gate insulating layer 120, the first interlayer insulating layer 130, the second interlayer insulating layer 140 and the protection insulating layer 150. The second planarization layer 170 may cover the boundary surface between the substrate (SUB) and the buffer insulating layer 110 corresponding to the lowermost insulating layer. The second planarization layer 170 may cover the edge of the opening portion (OP).

Referring to FIGS. 6 and 7B, the organic film, for example, the first planarization layer 160 may be disposed to cover the edge of the opening portion (OP). The organic film may cover the boundary surface between the substrate (SUB) and the lowermost insulating layer among the plurality of inorganic insulating layers in the edge of the opening (OP). For example, as shown in FIG. 7B, the first planarization layer 160 may be disposed to cover the boundary surface between the substrate (SUB) and the buffer insulating layer 110 in the edge of the opening portion (OP).

Also, the organic film may extend to cover lateral surfaces of the plurality of inorganic insulating layers in the edge of the opening portion (OP). For example, the first planarization layer 160 may extend to cover the lateral surfaces of the buffer insulating layer 110, the gate insulating layer 120, the first interlayer insulating layer 130, the second interlayer insulating layer 140 and the protection insulating layer 150 in the edge of the opening portion (OP).

According as the organic film covers the lateral surfaces of the plurality of inorganic insulating layers in the opening portion (OP), and the boundary surface between the substrate (SUB) and the lowermost insulating layer among the plurality of inorganic insulating layers, it is possible to prevent moisture from being permeated into the opening portion (OP).

Accordingly, it is possible to extend the lifespan of the electroluminescence display according to the embodiment of the present disclosure.

According to one or more embodiments of the present disclosure, an electroluminescence display comprises a substrate including a display area and a non-display area adjacent to the display area, a thin film transistor disposed in the display area, an integrated driver disposed in the non-display area and electrically connected with the thin film transistor, a plurality of test lines connected with the integrated driver and spaced apart from each other, and an opening portion configured to expose an upper surface of the substrate and obtained by removing a plurality of inorganic insulating layers disposed in the area between the plurality of test lines.

According to one or more embodiments of the present disclosure, the plurality of test lines are disposed between an end of the substrate and the integrated driver.

According to one or more embodiments of the present disclosure, the opening portion is disposed between an end of the substrate and the integrated driver.

According to one or more embodiments of the present disclosure, the electroluminescence display further includes an organic film disposed to cover an edge of the opening portion.

According to one or more embodiments of the present disclosure, the organic film covers the boundary surface between the substrate and the lowermost inorganic insulating layer among the plurality of inorganic insulating layers in the edge of the opening portion.

According to one or more embodiments of the present disclosure, the organic film covers lateral surfaces of the plurality of inorganic insulating layers in the edge of the opening portion.

According to one or more embodiments of the present disclosure, the plurality of inorganic insulating layers include a buffer insulating layer, a gate insulating layer, a first interlayer insulating layer, a second interlayer insulating layer and a protection insulating layer.

According to one or more embodiments of the present disclosure, the thin film transistor includes a semiconductor layer disposed on the buffer insulating layer, a gate electrode overlapped with the semiconductor layer under the condition that the gate insulating layer is interposed in-between, the first and second interlayer insulating layers disposed on the gate electrode, and source and drain electrodes disposed on the second interlayer insulating layer and connected with the semiconductor layer, and the protection insulating layer is disposed on the thin film transistor.

According to one or more embodiments of the present disclosure, the organic film covers the boundary surface between the substrate and the buffer insulating layer in the edge of the opening portion.

According to one or more embodiments of the present disclosure, the organic film extends to cover lateral surfaces of the buffer insulating layer, the gate insulating layer, the first interlayer insulating layer, the second interlayer insulating layer and the protection insulating layer in the edge of the opening portion.

According to one or more embodiments of the present disclosure, the end of the substrate corresponds to a trimming line.

According to one or more embodiments of the present disclosure, the opening portion is overlapped with the trimming line.

According to one or more embodiments of the present disclosure, an electroluminescence display comprises a substrate having a display area and a non-display area, a thin film transistor disposed on the display area, and a light emitting diode connected with the thin film transistor under the condition that a protection insulating layer and a first planarization layer are interposed in-between, wherein the non-display area includes an integrated driver electrically connected with the thin film transistor of the display area, a plurality of test lines connected with the integrated driver and extending to the outermost line of the substrate, and an opening portion overlapped with the outermost line of the substrate, and configured to expose an upper surface of the substrate by removing a plurality of inorganic insulating layers disposed in the area between the plurality of test lines spaced apart from each other.

According to one or more embodiments of the present disclosure, the outermost line of the substrate corresponds to a trimming line.

According to one or more embodiments of the present disclosure, an organic film is disposed to cover an edge of the opening portion.

According to one or more embodiments of the present disclosure, the organic film covers the boundary surface between the substrate and the lowermost insulating layer among the plurality of inorganic insulating layers in the edge of the opening portion, and the organic film extends to cover lateral surfaces of the plurality of inorganic insulating layers.

According to one or more embodiments of the present disclosure, the plurality of inorganic insulating layers include a buffer insulating layer, a gate insulating layer, a first interlayer insulating layer, a second interlayer insulating layer and a protection insulating layer.

According to one or more embodiments of the present disclosure, the thin film transistor includes a semiconductor layer disposed on the buffer insulating layer, a gate electrode overlapped with the semiconductor layer under the condition that the gate insulating layer is interposed in-between, the first and second interlayer insulating layers disposed on the gate electrode, and source and drain electrodes disposed on the second interlayer insulating layer and connected with the semiconductor layer, and the protection insulating layer is disposed on the thin film transistor.

According to one or more embodiments of the present disclosure, the test line is disposed in the same layer as the source and drain electrodes of the thin film transistor, and is formed of the same material as that of the source and drain electrodes of the thin film transistor.

According to one or more embodiments of the present disclosure, the electroluminescence display further includes a second planarization layer disposed on the first planarization layer, wherein the organic film is formed of at least one of the first planarization layer and the second planarization layer.

In the electroluminescence display according to the embodiment of the present disclosure, the opening portion is formed by removing the inorganic insulating layer on the trimming line of the display panel so that it is possible to prevent damages or cracks in the inorganic insulating layer on the substrate of the display panel for the trimming process using laser so as to realize the display panel having the differentiated portion.

Also, the electroluminescence display according to the embodiment of the present disclosure includes the organic film in the edge of the opening portion obtained by removing the inorganic insulating layer on the trimming line so as to prevent damages or cracks in the display panel for the trimming process so that it is possible to prevent moisture permeation through the inorganic insulating layer exposed in the opening portion, and furthermore, to prevent the separation between the substrate and the inorganic insulating layer by the moisture permeation.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a display area and a non-display area adjacent to the display area;
   a thin film transistor disposed in the display area;
   an integrated driver disposed in the non-display area and electrically connected with the thin film transistor;
   a plurality of test lines connected with the integrated driver and spaced apart from each other; and
   an opening portion configured to expose an upper surface of the substrate and obtained by removing a plurality of inorganic insulating layers disposed in the area between the plurality of test lines.

2. The display apparatus according to claim 1, wherein the plurality of test lines are disposed between an end of the substrate and the integrated driver.

3. The display apparatus according to claim 1, wherein the opening portion is disposed between an end of the substrate and the integrated driver.

4. The display apparatus according to claim 1, further comprising an organic film disposed to cover an edge of the opening portion.

5. The display apparatus according to claim 4, wherein the organic film covers a boundary surface between the substrate and a lowermost inorganic insulating layer among the plurality of inorganic insulating layers in the edge of the opening portion.

6. The display apparatus according to claim 5, wherein the organic film covers lateral surfaces of the plurality of inorganic insulating layers in the edge of the opening portion.

7. The display apparatus according to claim 6, wherein the plurality of inorganic insulating layers include a buffer insulating layer, a gate insulating layer, a first interlayer insulating layer, a second interlayer insulating layer and a protection insulating layer.

8. The display apparatus according to claim 7,
   wherein the thin film transistor includes a semiconductor layer disposed on the buffer insulating layer, a gate electrode overlapped with the semiconductor layer under a condition that the gate insulating layer is interposed in-between, the first and second interlayer insulating layers disposed on the gate electrode, and source and drain electrodes disposed on the second interlayer insulating layer and connected with the semiconductor layer, and
   the protection insulating layer is disposed on the thin film transistor.

9. The display apparatus according to claim 7, wherein the organic film covers the boundary surface between the substrate and the buffer insulating layer in the edge of the opening portion.

10. The display apparatus according to claim 7, wherein the organic film extends to cover lateral surfaces of the buffer insulating layer, the gate insulating layer, the first interlayer insulating layer, the second interlayer insulating layer and the protection insulating layer in the edge of the opening portion.

11. The display apparatus according to claim 3, wherein the end of the substrate corresponds to a trimming line.

12. The display apparatus according to claim 11, wherein the opening portion is overlapped with the trimming line.

13. An electroluminescence display comprising a substrate having a display area and a non-display area, a thin film transistor disposed on the display area, and a light emitting diode connected with the thin film transistor under a condition that a protection insulating layer and a first planarization layer are interposed in-between, wherein the non-display area includes:
an integrated driver electrically connected with the thin film transistor of the display area;
a plurality of test lines connected with the integrated driver and extending to the outermost line of the substrate; and
an opening portion overlapped with an outermost line of the substrate, and configured to expose an upper surface of the substrate by removing a plurality of inorganic insulating layers disposed in the area between the plurality of test lines spaced apart from each other.

14. The electroluminescence display according to claim 13, wherein the outermost line of the substrate corresponds to a trimming line.

15. The electroluminescence display according to claim 14, further comprising an organic film disposed to cover an edge of the opening portion.

16. The electroluminescence display according to claim 15, wherein the organic film covers a boundary surface between the substrate and a lowermost insulating layer among the plurality of inorganic insulating layers in the edge of the opening portion, and the organic film extends to cover lateral surfaces of the plurality of inorganic insulating layers.

17. The electroluminescence display according to claim 16, wherein the plurality of inorganic insulating layers include a buffer insulating layer, a gate insulating layer, a first interlayer insulating layer, a second interlayer insulating layer and a protection insulating layer.

18. The electroluminescence display according to claim 17,
wherein the thin film transistor includes a semiconductor layer disposed on the buffer insulating layer, a gate electrode overlapped with the semiconductor layer under the condition that the gate insulating layer is interposed in-between, the first and second interlayer insulating layers disposed on the gate electrode, and source and drain electrodes disposed on the second interlayer insulating layer and connected with the semiconductor layer, and
the protection insulating layer is disposed on the thin film transistor.

19. The electroluminescence display according to claim 18, wherein the test line is disposed in the same layer as the source and drain electrodes of the thin film transistor, and is formed of the same material as that of the source and drain electrodes of the thin film transistor.

20. The electroluminescence display according to claim 16, further comprising a second planarization layer disposed on the first planarization layer,
wherein the organic film is formed of at least one of the first planarization layer and the second planarization layer.

* * * * *